(12) United States Patent
Heidbrink et al.

(10) Patent No.: US 12,234,731 B2
(45) Date of Patent: Feb. 25, 2025

(54) WARNING DEVICE FOR A MINING CONTROL MODULE

(71) Applicant: Caterpillar Inc., Peoria, IL (US)

(72) Inventors: Dennis Heidbrink, Dülmen (DE); Martin Klein, Lünen (DE); Vera Krause, Lünen (DE)

(73) Assignee: Caterpillar Inc., Peoria, IL (US)

( * ) Notice: Subject to any disclaimer, the term of this patent is extended or adjusted under 35 U.S.C. 154(b) by 373 days.

(21) Appl. No.: 17/761,076

(22) PCT Filed: Sep. 16, 2020

(86) PCT No.: PCT/EP2020/025417
§ 371 (c)(1),
(2) Date: Mar. 16, 2022

(87) PCT Pub. No.: WO2021/052629
PCT Pub. Date: Mar. 25, 2021

(65) Prior Publication Data
US 2022/0372877 A1    Nov. 24, 2022

(30) Foreign Application Priority Data

Sep. 17, 2019  (GB) ...................... 1913380

(51) Int. Cl.
*E21F 17/18*    (2006.01)
*E21D 9/093*    (2006.01)
(Continued)

(52) U.S. Cl.
CPC .............. *E21F 17/18* (2013.01); *E21D 9/093* (2016.01); *G08B 21/18* (2013.01); *H05K 5/064* (2013.01)

(58) Field of Classification Search
None
See application file for complete search history.

(56) References Cited

U.S. PATENT DOCUMENTS 3,594,773 A    7/1971  Conkle et al.
4,227,760 A *  10/1980  Witek, Jr. ............ H01R 33/465
                                                            439/547
(Continued)

FOREIGN PATENT DOCUMENTS

CN    102689371        9/2012
CN    102536322 B      9/2013
(Continued)

OTHER PUBLICATIONS

International Search Report related to Application No. PCT/EP2020/025417; reported on Dec. 14, 2020.
(Continued)

*Primary Examiner* — Carlos Garcia (57) ABSTRACT

The present invention relates to a warning device for a mining control module for facilitating a replacement. Accordingly,, a warning device for a mining control module is suggested, which comprises a housing that is configured to be coupled with an opening provided at an outer surface of the control module, wherein the housing defines an inner cavity, and an alarm module which is arranged in said cavity and is configured to be releasably coupled to an inner control unit of the control module via said opening for receiving a control signal. The housing comprises a first portion that extends along a longitudinal axis and is configured to extend at least in part through the opening and a radially extending second portion that is configured to extend over the outer surface of the control module so as to cover the opening, when the device is coupled to the control module. The device furthermore comprises a fixation means, which is arranged on the second portion and is configured to releasably engage the outer surface of the control module so as to secure the device to the control module.

15 Claims, 3 Drawing Sheets

(51) Int. Cl.
*G08B 21/18* (2006.01)
*H05K 5/06* (2006.01)

(56) References Cited

U.S. PATENT DOCUMENTS

| | | | | |
|---|---|---|---|---|
| 4,398,237 | A * | 8/1983 | Doyel | F21L 2/00 362/186 |
| 4,600,977 | A | 7/1986 | Barlian et al. | |
| 4,727,358 | A | 2/1988 | Burt, III | |
| 5,278,741 | A * | 1/1994 | Ehrman | H01R 33/09 439/375 |
| 6,491,417 | B1 * | 12/2002 | Haen | B60Q 1/0023 362/540 |
| 6,614,108 | B1 | 9/2003 | Sanftleben et al. | |
| 7,486,859 | B2 * | 2/2009 | Oney | G02B 6/0006 385/39 |
| 8,125,320 | B2 | 2/2012 | Yamano | |
| 2002/0191392 | A1 * | 12/2002 | Garrity | F21V 15/01 362/171 |
| 2002/0191407 | A1 * | 12/2002 | Haen | B60Q 1/0023 362/11 |
| 2004/0070519 | A1 * | 4/2004 | Wu | F21V 5/045 340/815.45 |
| 2009/0034247 | A1 * | 2/2009 | Boyer | F21V 31/04 362/225 |
| 2013/0322093 | A1 * | 12/2013 | Ono | F16B 2/248 362/396 |
| 2020/0077929 | A1 * | 3/2020 | Missanelli | A61B 5/6875 |

FOREIGN PATENT DOCUMENTS

| | | |
|---|---|---|
| CN | 108550244 | 9/2018 |
| CN | 108685149 | 10/2018 |
| FR | 2275839 A1 | 1/1976 |
| RU | 182387 U1 | 8/2018 |
| WO | 2015110810 A1 | 7/2015 |

OTHER PUBLICATIONS

Great Britain Search Report related to Application No. 1913380.0; reported on Mar. 4, 2020.

* cited by examiner

WARNING DEVICE FOR A MINING CONTROL MODULE

CROSS-REFERENCE TO RELATED APPLICATION

This Application is a 35 USC § 371 US National Stage filing of International Application No. PCT/EP2020/025417 filed on Sep. 16, 2020 which claims priority under the Paris Convention to Great Britain Patent Application No. No. 1913380.0 filed on Sep. 17, 2019.

TECHNICAL FIELD

The present invention pertains to a warning device for a mining control module for facilitating a replacement of a warning device as well as a corresponding mining control module comprising such warning device.

TECHNOLOGICAL BACKGROUND

Warning devices such as e.g. buzzers or beepers are known to interact with control interfaces or control units of electronic devices that monitor the operational conditions of system components and provide that a user may be alerted in case of a detected unfavorable condition or an exceeding of a predefined threshold. For example, a control unit configured to control one or more functions of a device may be coupled with a pressure or proximity sensor and may output a warning signal, when a pressure or proximity is detected and it is determined, e.g. via a control or evaluation logic, that said pressure or proximity exceeds a predefined tolerance limit. In such case, a warning signal may be provided in the form of an acoustic signal, such that a user's attention is drawn to a potential malfunctioning or critical operation condition.

In mining applications such warning functionalities are absolutely essential in order to provide a safe working environment for users working in underground conditions. The various modules of longwall mining systems, for example, require an exact adjustment to the underground conditions, which vary dynamically and continuously and may depend on the application. For example, roof supports or shields are generally forwarded sequentially, wherein a jamming of a guiding rail and/or a sudden roof elevation may require a manual intervention or inspection, such that the user is notified by a warning device or beeper connected to a corresponding programmable control module of the longwall system.

The underground conditions generally provide a moist and considerably rough environment, which is further increased by the mining operation. For example, water may be used for cooling purposes and may be sprayed from e.g. roof supports to facilitate the mining application. Furthermore, the shearing activity fills the air with dust and particles and may cause scrap or fragments to be propelled towards the control module of the respective roof support. Accordingly, both water, dust and scrap particles may impact the outer surface of the control module, such that the control module has to be construed and built with a predefined level of robustness so as to avoid any adversary damaging effects and to be compatible with underground operation.

For this reason, current beepers are generally soldered to the outside surface of the respective control module so as to prevent water from penetrating the inner electronic components of the control module and providing structural resistance to avoid damage upon impact. For safety reasons, however, beepers need to be replaced after a predefined period of time, generally after about five years, in order to guarantee functionality of the beeper. The disassembly requires considerable effort and includes the disintegration of the material bonding provided by the soldering. Furthermore, the connection of the beeper with the inner control logic of the control module is provided in the interior of the control module and is hence not directly accessible from the outside.

Accordingly, the maintenance cannot be performed underground, such that the control module needs to be returned to the surface, resulting in a replacement that may take up to several hours. This causes the respective shield or roof support to be inactive during the replacement, which hence leads to a significant downtime of the longwall system, which is not economical and significantly reduces the overall shearing and production.

Therefore, a need exists to facilitate and expedite the replacement of beepers for mining control modules so as to reduce the downtime of the longwall system.

SUMMARY OF THE INVENTION

Starting from the prior art, it is an objective to provide a new and inventive warning device for a mining control module. In particular, it may be an objective to provide a warning device that facilitates replacement with reduced implementation effort while ensuring a sealing of the electronic components comprised within such mining control module.

This objective is solved by means of a warning device with the features of claim 1 as well as a mining control module with the features of claim 14. Preferred embodiments are set forth in the present specification, the Figures as well as the dependent claims.

Accordingly, a warning device for a mining control module is suggested, which comprises a housing that is configured to be coupled with an opening provided at an outer surface of the control module, wherein the housing defines an inner cavity, and an alarm module which is arranged in said cavity and is configured to be releasably coupled to an inner control unit of the control module via said opening for receiving a control signal. The housing comprises a first portion that extends along a longitudinal axis and is configured to extend at least in part through the opening and a radially extending second portion that is configured to extend over the outer surface of the control module so as to cover the opening, when the device is coupled to the control module. The device furthermore comprises a fixation means, which is arranged on the second portion and is configured to releasably engage the outer surface of the control module so as to secure the device to the control module.

Furthermore, a mining control module is suggested, which comprises an inner control unit, an outer surface with an opening, and a corresponding warning device. The warning device is secured to the outer surface by means of the fixation means, the second portion covers the opening, and a first portion is received by the opening, wherein the control unit is releasably coupled with the alarm module of the warning device via a wiring and said opening.

BRIEF DESCRIPTION OF THE DRAWINGS

The present disclosure will be more readily appreciated by reference to the following detailed description when being considered in connection with the accompanying drawings in which.

DETAILED DESCRIPTION OF PREFERRED EMBODIMENTS

In the following, the invention will be explained in more detail with reference to the accompanying figures. In the Figures, like elements are denoted by identical reference numerals and repeated description thereof may be omitted in order to avoid redundancies.

Figure 1:
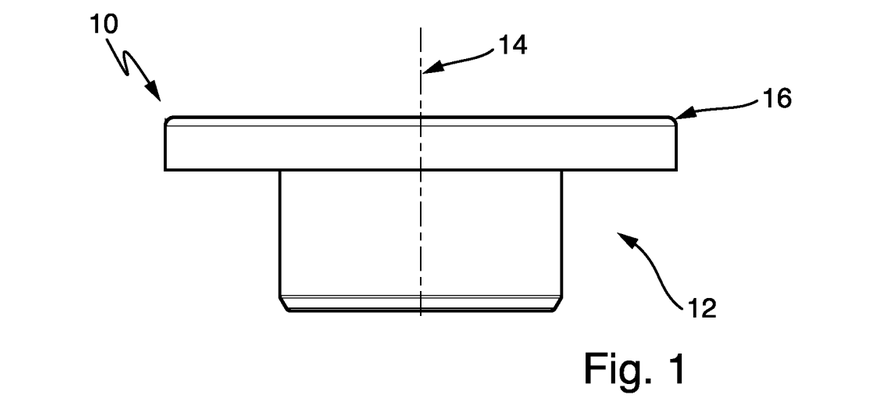
FIG. 1 depicts a schematic side view of a housing of a warning device.

In FIG. 1 a warning device is schematically shown in a side view, wherein a housing 10 of the warning device comprises a first portion 12, which extends along a longitudinal axis 14. Here, the first portion 12 comprises an essentially cylindrical shape, which intersects with a second portion 16 of the housing 10, extending in a radial direction relative to the longitudinal axis 14. While the first portion 12 is adapted to be received by an opening and interior of a control module, comprising a chamfer or guiding surface at the opposing end of the second portion 16, the second portion 16 is adapted to extend over the opening and an outer surface of the control module so as to cover the opening in its entirety.

Figure 2:
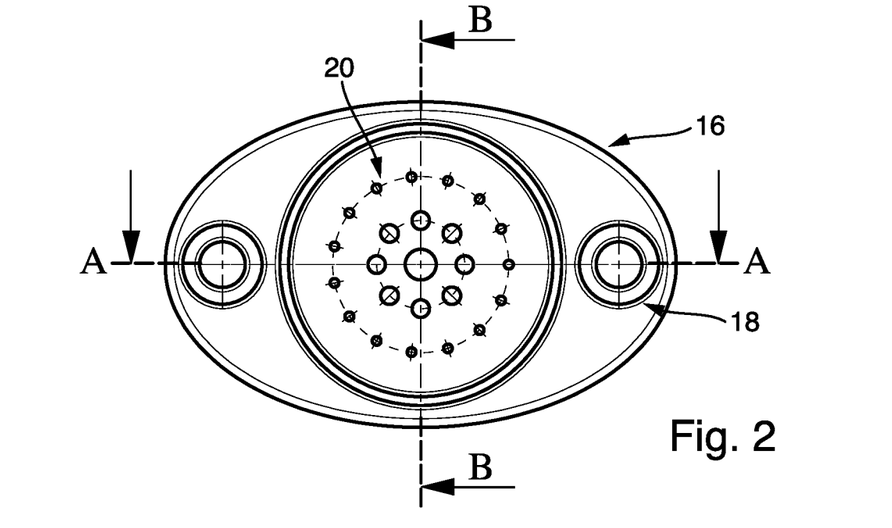
FIG. 2 depicts a top view of the embodiment according to FIG. 1.

A more detailed view of the second portion 16 is provided in FIG. 2, which indicates a top view of the housing 10 of the warning device. Accordingly, the second portion 16 comprises a cross-section having an ellipsoid shape, such that the second portion 16 comprises two radially extending or flaring arms. Each of said arms comprises a fixation means 18, which is here depicted as a respective through hole. By means of the fixation means 18, the second portion 16 may be attached to the outer surface of a control module, such that the second portion 16 is brought flush with said outer surface and covers an opening accommodating the first portion 12 of the housing 10. Said first portion 12 is depicted in FIG. 2 as the circular shape extending through or extending from the second portion 16.

In this embodiment the first portion 12 is sized and dimensioned to be fully received by the opening and the interior of the control module with only minimal spacing between the first portion 12 and the opening. Accordingly, the ellipsoid shape of the second portion 16 fully covers the opening, such that the second portion 16 seals the opening, when the warning device is coupled to the control module. However, it will be understood that a variety of shapes and dimensions are possible, e.g. also polygonal and rectangular shapes as long as the second portion 16 is dimensioned and shaped to cover the opening of the control module. Hence, the shapes depicted herein are not limiting.

The second portion 16 furthermore comprises a plurality of through holes 20 or openings, which provide a fluid communication between an inner cavity (not shown) of the housing 10 and which is configured to accommodate an alarm module (not shown). Thereby, the alarm signals generated by the alarm module, e.g. visual, acoustic, vibrational, and/or haptic signals may be more easily propagated and transduced to the surroundings and/or detected. The openings or through holes 20 hence form a cover for the inner cavity, which is merely optional and may furthermore be integral with the first portion 12 or second portion 16.

Figure 3:
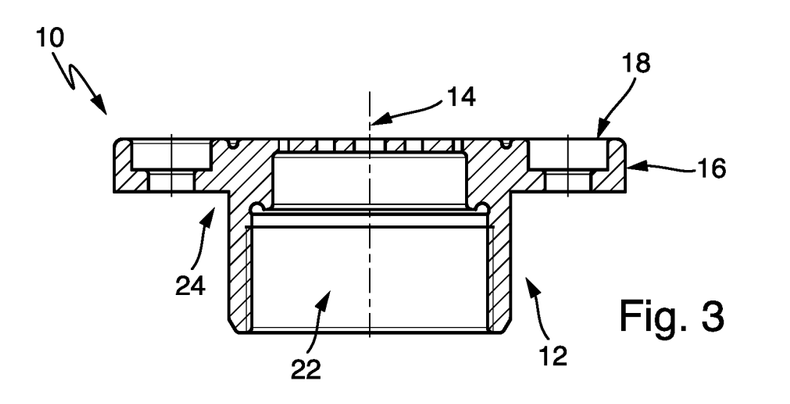
FIG. 3 depicts a sectional view according to line A-A of the embodiment depicted in FIG. 2.

FIG. 3 depicts a sectional view of the warning device according to line A-A of the embodiment depicted in FIG. 2. Accordingly, the inner cavity 22 is depicted as a contiguous inner space with an open end opposite to the second portion 16. Furthermore, the first portion 12 and second portion 16 essentially form a T-shape in a cross-sectional profile of the housing along line A-A and define a shoulder portion 24 at the connecting interface. Said shoulder 24 may accommodate a sealing member so as to provide a fluidic sealing of the opening of a control module, when the warning device is secured to the control module.

Alternatively, the second portion 16 or the flaring arms thereof may at least in part be formed of a flexible and/or resilient material, which provides a sealing upon fixation of the fixation means 18. Such flexible material may e.g. be embedded as an additional layer or coating or the second portion 16 may be formed of such material at least at the flaring arms.

The fixation means 18 are furthermore arranged radially outward from the shoulder 24, which facilitates the fixation and provides an improved distribution of the securing forces by providing a larger contact area. This also provides that the sealing is not impaired by the fixation.

The radial arms of the second portion 16 furthermore facilitate the handling of the warning device by providing a gripping portion for the user and by facilitating the alignment of the warning device with respect to the opening of a control module, i.e. by defining orientation marks for proper alignment.

Figure 4:
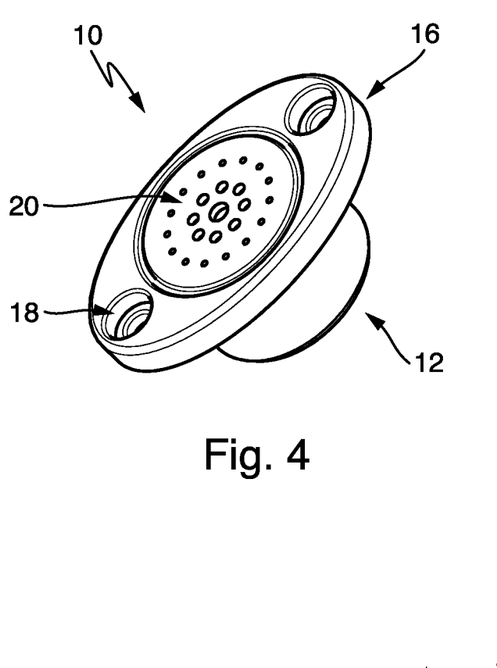
FIG. 4 depicts a top perspective view of the housing according to FIGS. 1 to 3.
Figure 5:
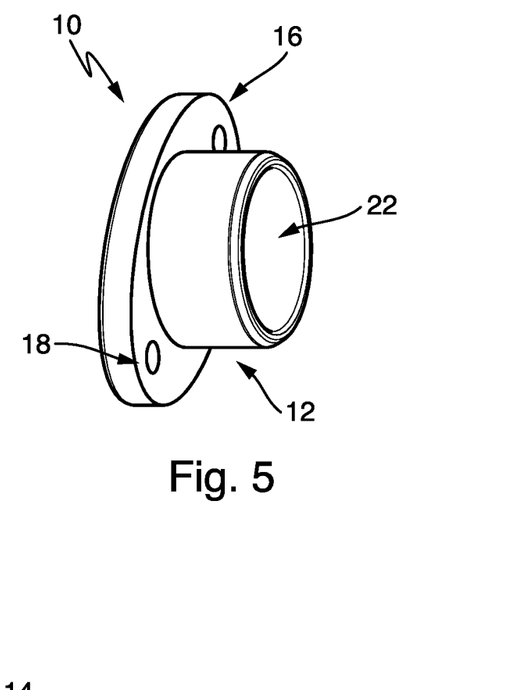
FIG. 5 depicts a bottom perspective view of the housing according to FIGS. 1 to 3.

FIGS. 4 and 5 depict the housing according to FIGS. 1 to 3 in a top and bottom perspective view, respectively. Here, the flaring or radial arms of the second portion 16 are more apparent and demonstrate how the housing 10 may be rotated into a predefined position even after the first portion 12 has been inserted into an opening of a control module so as to properly align the warning device. The ellipsoid surface is arranged symmetrically yet biases the warning device in a predefined position, wherein the warning device may also be inserted in a reverse orientation.

Figure 6:
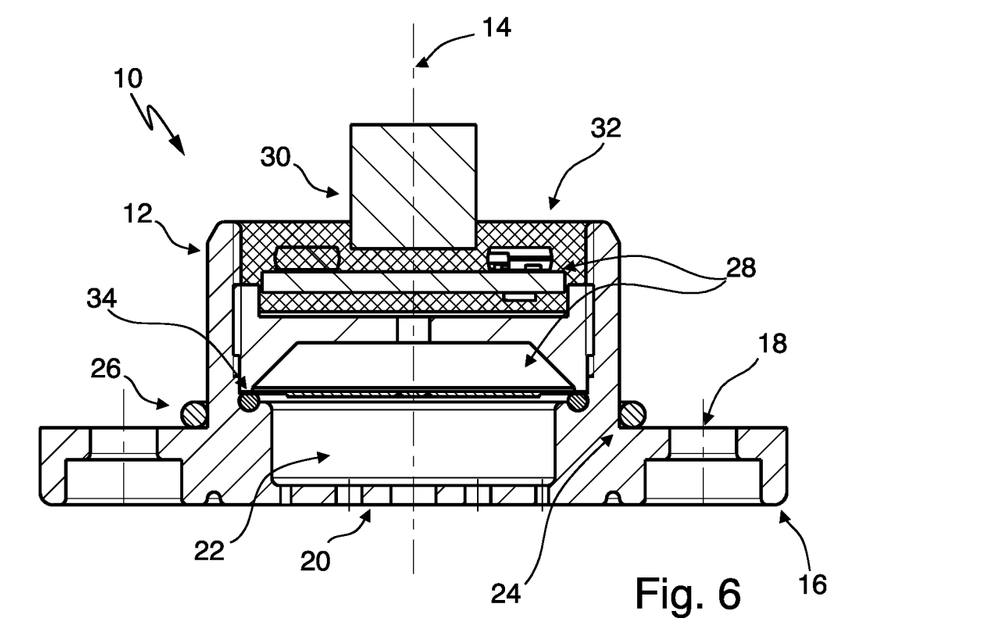
FIG. 6 depicts a sectional view according to line A-A of the embodiment depicted in FIG. 2 with further components of the warning device.

In FIG. 6 a sectional view according to line A-A of the embodiment depicted in FIG. 2 is shown, wherein the warning device and housing 10 thereof comprise further components. Accordingly, the housing 10 defines an inner cavity 22, which extends from the second portion 16 to an opposing end of the first portion 12 and accommodates an alarm module 28, which is depicted as a piezo element and is electrically connected to an electrical coupling element 30 for receiving power and control signals. The alarm module 28 is securely retained in the inner cavity 22 by means of a potting material 32 on the open end of the first portion 12 and the second portion 16 on the opposing end and is furthermore held by the inner wall of the inner cavity 22. The alarm module 28 is configured as an acoustic module, so as to provide an acoustic alarm signal. However, other alarm modules may be implemented, e.g. a visual alarm module in the form of a warning light and/or a haptic alarm module, e.g. in the form of an electromechanical transducer.

By means of the alarm module 28 and the inner cavity 22 which may in part define a sound box, acoustic or other alarm signals signals may be generated and outputted based on the received control signal via the electrical coupling component 30 from a control unit of a control module. Acoustic signals may e.g. provide an alarm signal, which alerts a user to a potential problem or malfunctioning in the system, e.g. a longwall mining system. In order to improve the propagation and transduction, the outer surface of the second portion 16 comprises a plurality of through holes 20 or openings, as described in the above in view of FIG. 3.

To ensure that the interior of the control module housing electronic components and the electronic components of the warning device are protected from water or other liquids and dirt entering through said openings, the housing 10 furthermore comprises a sealing member 34, which is arranged between the piezo element and the inner surface of the second portion 16. Said sealing member 34 may be formed as an O-ring or similar components, surrounding the piezo element in a circumferential manner.

By the same token, the shoulder 24 of the housing 10 accommodates a sealing member 26, which ensures that the opening of the control module is fluidically sealed, when the warning device is coupled to the control module. As depicted, the through hole or fixation means 18 is arranged radially outward from the sealing member 26, such that a received fixation element, e.g. a screw, does not interfere with the sealing member 24.

Figure 7:
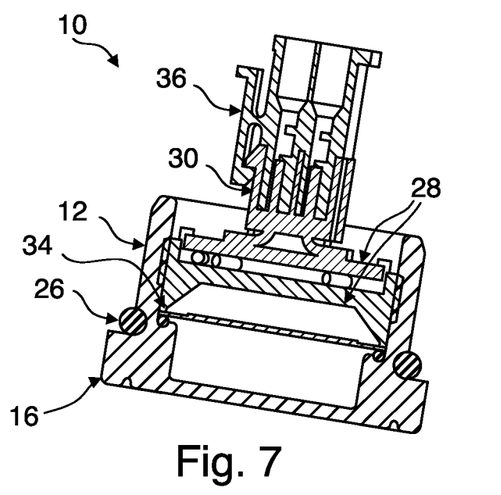
FIG. 7 depicts a sectional view according to line B-B of the embodiment depicted in FIG. 2 with further components of the warning device.

FIG. 7 depicts a sectional view according to line B-B of the embodiment depicted in FIG. 2 with further components of the warning device, similar to the embodiment depicted in FIG. 6. Accordingly, the radially extending arms are not shown, but shoulder 24 sufficiently extends around the circumference of the second portion 16 so as to accommodate the sealing member 24 along the entire circumference.

The electrical coupling element 30 is furthermore shown in a situation, wherein the warning device is electrically coupled to the control unit of a control module via a second electrical coupling element 36 of the control unit. Such second electrical coupling element 36 may be connected to the control unit via a corresponding wiring, such that the coupling connection may be removed from the interior of the control module, when the warning device is disassembled and removed from the opening of the control module. The electrical coupling elements 30, 36 are furthermore optionally connected via a snap-fit arrangement, wherein a resilient member of the second electrical coupling element 36 comprises a guiding surface or chamfer and provides a mechanical interlocking with a corresponding detent or protrusion formed on the electrical coupling element 30 of the warning device. By adjusting the resilient member, both elements 30, 36 may accordingly be decoupled, such that a replacement warning device may be connected to the respective control module. Thereby, a user may perform the replacement in underground conditions from the outside of the control module and without exposing the circuitry and electronic components housed within the control module.

Figure 8:
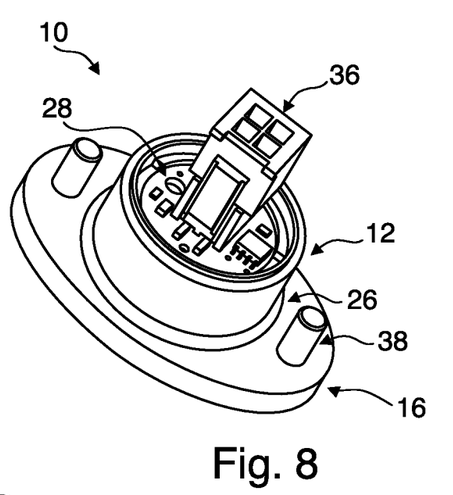
FIG. 8 depicts a bottom perspective view of the warning device according to FIG. 6.

FIG. 8 depicts a bottom perspective view of the warning device according to FIGS. 6 and 7, wherein the second electrical coupling element 36 is shown to have four electrical channels for providing the required power connection and to receive control signals. Furthermore, the radial arms comprising the fixation means 18 in the form of through holes are shown with received screws 38, which are sized and dimensioned to engage corresponding bores on the outer surface of a control module. According, the screws 38 extend from a surface of the second portion 16, which is brought flush with the outer surface of the control module, when the warning device is securely attached to the control module and wherein the sealing member 26 provides a continuous seal of the opening to prevent fluid entry. Furthermore, the fixation means 18 and screws 38 are arranged such that a radial, axial, and rotational movement of the warning device is prevented, when the warning device is secured to the control module.

Figure 9:
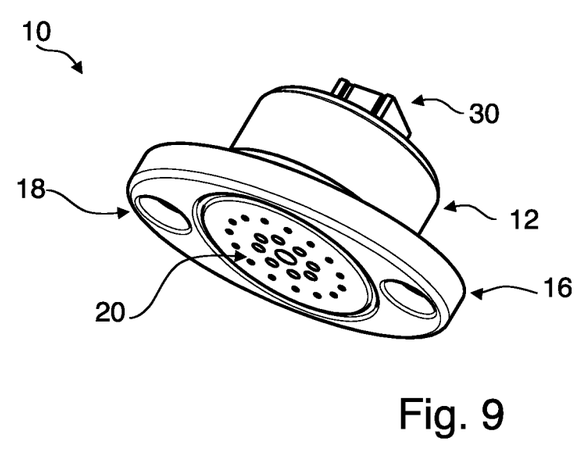
FIG. 9 depicts a top perspective view of the warning device according to FIG. 6.

The warning device hence provides a robust device with easy implementation, only requiring a fixation of the fixation means 18 and a coupling of the electric coupling element 30 with the corresponding interface of a control module. Due to the optional flaring, radial arms, as depicted in the top perspective view of FIG. 9, the correct positioning and the handling of the warning device are furthermore facilitated, such that a replacement can be performed by a user in an underground environment without significantly affecting the operation time of a mining system, such as a longwall mining system.

It will be obvious for a person skilled in the art that these embodiments and items only depict examples of a plurality of possibilities. Hence, the embodiments shown here should not be understood to form a limitation of these features and configurations. Any possible combination and configuration of the described features can be chosen according to the scope of the invention.

This is in particular the case with respect to the following optional features which may be combined with some or all embodiments, items and/or features mentioned before in any technically feasible combination.

A warning device for a mining control module may be provided.

The warning device comprises a housing that is configured to be coupled with an opening provided at an outer surface of the control module, wherein the housing defines an inner cavity, and an alarm module which is arranged in said cavity and is configured to be releasably coupled to an inner control unit of the control module via said opening for receiving a control signal. The housing comprises a first portion that extends along a longitudinal axis and is configured to extend at least in part through the opening and a radially extending second portion that is configured to extend over the outer surface of the control module so as to cover the opening, when the device is coupled to the control module. The device furthermore comprises a fixation means, which is arranged on the second portion and is configured to releasably engage the outer surface of the control module so as to secure the device to the control module.

The opening of the control module hence provides an entry from the outside of the control module into the interior, which accommodates the electronic components including the control unit and/or power circuit. The first portion of the housing may e.g. be of an essentially cylindrical shape that protrudes into the opening and which facilitates the placement of the warning device at the correct position. For example, the first portion may comprise an essentially cylindrical shape with a continuous outer circumference and/or be generally symmetrical, such that the first portion may be easily inserted into the opening.

To further facilitate the insertion, an end portion of the first portion opposite of the second portion may furthermore be chamfered.

Alternatively, the first portion may comprise an asymmetrical shape, such that the first portion of the housing may be inserted into the opening only in a limited number of orientations, preferably biasing the housing in a single predefined position relative to the control module. For example, the first portion may comprise a rectangular, triangular or polygonal cross-section and/or may comprise one or more protrusions matching one or more recesses or cut-outs of the opening.

The second portion extends radially outward, i.e. in a direction essentially perpendicular to the longitudinal axis of the housing or first portion. The second portion thereby extends over the outer surface of the control module and covers the opening of the control module, when the first portion is inserted into the opening. The first portion and second portion may be integrally formed, i.e. may be made of a single piece, such that a connecting portion may be provided, from which the longitudinal portion and radial portion extend. Alternatively, said portions may also form separate components of the housing. The housing may hence form a shield or cover, sealing the opening and protecting the inner cavity of the control module from external influences.

The housing may be formed of a polymer, metal, ceramic, or composite material. Preferably, the housing is made of a polymer material, such that an economical yet robust solution is provided and the housing may be manufactured by means of e.g. injection molding or extrusion.

The device furthermore comprises a fixation means, which is arranged on the second portion and is configured to releasably engage the outer surface of the control module so as to secure the device to the control module.

The fixation means may e.g. comprise a clamp or fastener or other means to securely attach the housing to the control module, preferably sealing the interior of the control module from external influences.

The releasable attachment provides that the user no longer needs to perform cutting, welding, or soldering techniques to remove the housing from the control module and may perform the replacement in underground conditions, thereby significantly reducing the time effort for replacing the warning device and the downtime of the system.

To provide a warning signal, the device furthermore comprises an alarm module, which is accommodated in the housing and is configured to provide an alarm signal so as to alert a user e.g. in the case of a system malfunction or a detected problem. The alarm module may e.g. be configured to provide an acoustic, visual, vibrational, and/or haptic signal. Configured as an acoustic module, the alarm module may be configured to provide a continuous or periodic sound, which may be either monotonous or have a varying pitch and/or frequency. The device may furthermore be configured to stop the outputting of a warning signal upon a user input on an interface of the control module, such that a physical presence of the user is required and it may hence be ensured that the outputting is only stopped prior to a manual intervention of the user.

To further facilitate the coupling of the warning device with the control module, the alarm module may comprise an electrical coupling element configured to be releasably connected to a wired electrical coupling element of the control unit via said opening.

The electrical coupling may e.g. be formed as a plug or socket matching a terminal of the wired electrical coupling element. This allows that the electrical coupling element may be easily removed from the interior of the control module due to the extension wiring after the fixation means has been loosened and the housing is removed from the outer surface of the control module. Alternatively, the electrical coupling may directly engage a corresponding geometry of the control unit, e.g. by a protruding element.

Accordingly, a user may simply replace the warning device by removing the housing by loosening the fixation means and by pulling the wiring out of the control module via the opening. The user then may decouple the electronic coupling element and attach the electronic coupling element of a replacement warning device to the coupling element of the control module and may fix the replacement warning device by inserting the wiring into the interior of the control module, inserting the first portion into the opening and by fixing the fixation means, such that the second portion covers the opening and is securely attached to the control module. Thereby, the replacement may be performed in a matter of minutes rather than hours, when a soldered fixation is provided and the control module needs to be brought to surface for replacement. Furthermore, such replacement may not even require a full shutdown of the control module and respective mining appliance, e.g. by providing a configuration of the control module and warning system, which allows the replacement to occur under electrical voltage and further reduces the down-time of the longwall system.

The electrical coupling element is preferably configured to be coupled by means of interference fit, positive locking, or snap-fit. For example, the electrical coupling element may be formed as a body having a resilient member and which may be inserted into a corresponding socket having a shape matching the body or dimensioned smaller, such that the body needs to be pressed into the socket and is held by means of frictional forces. By the same token, the resilient member may comprise a protrusion, which snaps into a corresponding recess or groove of the socket upon insertion and which may be released by actuation of the resilient member.

Preferably, the electrical coupling element is configured as a plug-in connector or screw connector. Such connectors are readily available and may further facilitate the coupling and decoupling between the control unit and the alarm module of the warning device. Since the both electrical coupling elements are housed within the control module and/or the inner cavity of the housing, e.g. in an inner cavity provided in the first portion, the electrical coupling elements are protected against external influences and are hence generally only susceptible to forces acting upon the control module due to normal operation. Accordingly, the plug-in connector or screw connector provide a sufficient stability of the connection while at the same time providing a releasable attachment, which may be handled by a user upon replacement without requiring particular tools.

Since the mining conditions provide a moist environment and may cause that liquids are being brought into contact with the control module, the housing preferably fluidly seals the opening so as to prevent water or other fluids from entering the interior of the control module. Accordingly, the second portion preferably comprises a flexible portion so as to fluidly seal the opening, when the device is coupled to the control module. Such flexible portion may hence adapt to the outer surface of the control module adjacent to the opening, such that a contacting interface is provided, when the fixation means secures the warning device to the control module. The contacting interface hence prevents a fluid communication between the interior of the control module and the exterior of the control module in the region of the warning device, such that the electronic components accommodated in the control module are protected against fluid entrance and electronic damage.

The second portion may e.g. be formed at least in part of a flexible material. Such flexible or resilient material may be provided by a polymer material, which is provided as a top layer on the second portion facing the outer surface of the control module upon coupling of the device. Due to the fixation, the flexible material is compressed and hence forms a seal preventing fluid from entering into the opening covered by the second portion.

The first portion and the second portion may also define a shoulder, wherein a sealing member is arranged at the shoulder. For example, the first portion and second portion may be formed as a T-shape, wherein the second portion defines the smaller portion, such that the longitudinal portion of the first portion extends from the second portion and the shoulder is defined at the connecting region. The sealing member may e.g. be provided as an O-ring, which may be received by a recess formed at the connecting region or shoulder. Thereby, the O-ring may be provided directly at the circumference of the opening, such that the radial extension of the second portion may be reduced and a larger versatility of the fixation means and its arrangement may be provided.

Accordingly, the fixation means is preferably arranged at a position radially outward from the shoulder and sealing member.

For example, the shoulder and sealing member may be arranged at an inner circumference of the second portion while the fixation means is arranged at a region of an outer circumference of the second portion. This has the advantage that forces acting upon the second portion due to the fixation means, e.g. a compressive force, also apply to the sealing member while the forces may be distributed more equally and an improved structural stability is provided that does not impair the sealing.

In order to facilitate the fixation and removal of the warning device the fixation means preferably comprises two or more screws, wherein the second portion comprises two or more through holes for receiving the two or more screws. Although the through holes may be provided at various positions on the second portion relative to the longitudinal axis of the first portion, the through holes are preferably arranged symmetrically and at equal spacing from each other, e.g. along a circular section of the second portion or circumference.

The use of screws ensures that a compressive force may be adjusted and provides a level of flexibility as to the outer surface of the control module, e.g. in the case of recesses or varying depths of the outer surface between different control modules. Furthermore, this provides that the fixation means may be easily released without requiring a considerable amount of strength for removing and replacing the warning device. In addition, the screwing fixation ensures that no loosening occurs due to axial or radial forces that are developed during operation of the control model and the corresponding mining appliance.

The alarm module may furthermore comprise an acoustic module or electromechanical transducer, preferably a piezo element. Thereby, a robust signal generator is provided, which may output an acoustic and/or haptic or vibrational signal as required according to a received control signal from the control unit of the control module. Furthermore, the electromechanical transducer may be arranged to fully cover the inner cavity of the housing, such that external factors such as moisture or liquid or fluid build-up may not enter the interior of the control module via the warning device.

The alarm module may also be in communication with the exterior of the second portion to provide a more direct outputting. Such communication may e.g. be provided by a flexible member that covers the alarm module and transfers the alarm or acoustic signal. Preferably, the second portion comprises at least one opening or through hole communicatively coupling the alarm module with an exterior of the second portion, wherein a second sealing member is arranged between the alarm module and the second portion so as to fluidly seal the inner cavity.

In other words, the alarm module may be covered by the second portion, but an air cavity may be provided between the outer surface of the second portion and the alarm module, wherein the outer surface of the second portion preferably comprises a plurality of holes which allow the alarm signal to be propagated and detected out of the warning device to the surroundings. In order to ensure that no liquids or fluids enter the interior of the control module, the second sealing member is provided, which is arranged at a boundary or edge of the alarm module facing the second portion and is arranged between the alarm module and an inner surface of the second portion. The second sealing member may e.g. be formed as an O-ring or sealing ring made of a flexible material.

For an easy insertion and correct placement of the housing of the warning device, the circumference and shape of the first part may essentially correspond to the circumference and shape of the opening, wherein said shape is preferably essentially circular or ellipsoid. By providing a circular shape in a sectional view of the first part the insertion may not require a particular orientation and the correct placement may be provided after insertion, e.g. by rotation of the warning device along the longitudinal axis. This also ensures that the insertion may be provided in a wide variety of openings, e.g. both circular openings and rectangular or ellipsoid openings having a larger cross-sectional surface.

Alternatively, an ellipsoid surface may be provided, which biases the warning device in a predefined position. Preferably, the warning device and the fixation means are arranged symmetrically, such that the warning device may also be inserted in a reverse orientation.

To further ensure that the alarm module is retained in the inner cavity, a potting material may be arranged in the inner cavity at a portion opposite of the second portion and arranged to secure at least the alarm module in the housing. For example, the potting or compound may be an epoxy-based material or polyurethane, which seals of the end of the first portion protruding into the control module and forms a boundary with positive locking for the alarm module, such that the alarm module is held by the potting on the one end and the second portion at the second end, while a radial and/or rotational movement may be prevented by the inner wall of the inner cavity.

Furthermore, a mining control module is suggested, which comprises an inner control unit, an outer surface with an opening, and a corresponding warning device. The warning device is secured to the outer surface by means of the fixation means, the second portion covers the opening, and a first portion is received by the opening, wherein the control unit is releasably coupled with the alarm module of the warning device via a wiring and said opening.

Preferably, such mining control module is configured for controlling a roof support shield.

Accordingly, the warning device may be implemented in longwall systems, wherein the programmable control module may control various functions of the respective roof support shield. Should the warning device, e.g. a beeper need to be replaced, the fixation means may simple be loosened and the first portion of the warning device may be pulled out of the opening of the control module, wherein an electrical coupling is provided by means of a wired corresponding electrical coupling element of the control unit, which may be detached from the outside by pulling out the connecting wire. The replacement warning device may then be coupled to the wiring, after which the wiring and first portion are inserted into the opening and the second portion is secured to the outer surface of the control module by means of the fixation means. Thereby, the longwall system may only have a downtime of several minutes or may even be continuously operated, e.g. by a corresponding configuration of the control module allowing the replacement to occur under voltage.

INDUSTRIAL APPLICABILITY

With reference to the Figures, a warning device for a mining control module and a mining control module equipped with such warning device are suggested. The suggested warning device as mentioned above is applicable in any mining appliance, such as a longwall mining system or roof support shield, which is controlled by respective control modules and require safety monitoring. Further, the warning device may replace conventional soldered and wired warning devices as a replacement or retrofit part, which may be exchanged e.g. upon overhaul.

The invention claimed is:

1. A warning device for a mining control module, comprising:
    a housing, configured to be placed partially through an opening provided at an outer surface of the mining control module, said housing defining an inner cavity,
    an alarm module configured as an acoustic module, arranged in said inner cavity and configured to be releasably coupled to an inner control unit of the mining control module via said opening for receiving a control signal,
    wherein the housing comprises a first portion extending along a longitudinal axis and configured to extend at least in part through the opening and a radially extending second portion configured to extend over the outer surface of the mining control module so as to cover the opening, when the warning device is coupled to the mining control module,
    wherein the warning device comprises a fixation means arranged on the second portion and configured to releasably engage the outer surface of the mining control module so as to secure the warning device to the mining control module.

2. The warning device according to claim 1, wherein the fixation means comprises two or more screws and wherein the second portion comprises two or more through holes for receiving the two or more screws.

3. The warning device according to claim 1, wherein the alarm module comprises an acoustic module or an electromechanical transducer, preferably a piezo element.

4. The warning device according to claim 1, wherein the second portion comprises at least one opening or through hole communicatively coupling the alarm module with an exterior of the second portion and wherein a second sealing member is arranged between the alarm module and the second portion so as to fluidly seal the inner cavity.

5. The warning device according to claim 1, wherein the circumference and shape of the first portion essentially corresponds to the circumference and shape of the opening, said shape preferably being essentially circular or ellipsoid.

6. The warning device according to claim 1, comprising a potting material arranged in the inner cavity at a portion opposite of the second portion and arranged to secure at least the alarm module in the housing.

7. A mining control module, comprising an inner control unit, an outer surface with an opening, and a warning device according to claim 1, wherein the warning device is secured to the outer surface by means of the fixation means, the second portion covers the opening, and a first portion is received by the opening, and wherein the control unit is releasably coupled with the alarm module of the warning device via a wiring and said opening.

8. The mining control module according to claim 7 configured for controlling a roof support shield.

9. The warning device according to claim 1, wherein the alarm module comprises an electrical coupling element configured to be releasably connected to a wired electrical coupling element of the control unit via said opening.

10. The warning device according to claim 9, wherein the electrical coupling element is configured to be coupled by means of interference fit, positive locking, or snap-fit.

11. The warning device according to claim 9, wherein the electrical coupling element is configured as a plug-in connector or screw connector.

12. The warning device according to claim 1, wherein the second portion comprises a flexible portion so as to fluidly seal the opening, when the warning device is coupled to the mining control module.

13. The warning device according to claim 12, wherein the second portion is formed at least in part of a flexible material.

14. The warning device according to claim 12, wherein the first portion and the second portion define a shoulder and wherein a sealing member is arranged at the shoulder.

15. The warning device according to claim 14, wherein the fixation means is arranged at a position radially outward from the shoulder and sealing member.

* * * * *